(12) United States Patent
Laluet et al.

(10) Patent No.: US 9,709,246 B2
(45) Date of Patent: Jul. 18, 2017

(54) GLASS-CERAMIC ARTICLE WITH LUMINOUS DISPLAY

(71) Applicant: EUROKERA S.N.C., Chateau-Thierry (FR)

(72) Inventors: Jean-Yves Laluet, Paris (FR); Pierrick Guiset, Massy (FR); Pablo Vilato, Paris (FR); Claire Mallet, Outremont (CA)

(73) Assignee: EUROKERA S.N.C., Chateau-Thierry (FR)

( * ) Notice: Subject to any disclaimer, the term of this patent is extended or adjusted under 35 U.S.C. 154(b) by 180 days.

(21) Appl. No.: 14/442,619

(22) PCT Filed: Nov. 13, 2013

(86) PCT No.: PCT/FR2013/052719
§ 371 (c)(1),
(2) Date: May 13, 2015

(87) PCT Pub. No.: WO2014/076411
PCT Pub. Date: May 22, 2014

(65) Prior Publication Data
US 2016/0281961 A1    Sep. 29, 2016

(30) Foreign Application Priority Data

Nov. 14, 2012 (FR) ..................................... 12 60827

(51) Int. Cl.
*F21V 9/16* (2006.01)
*C03C 10/00* (2006.01)
(Continued)

(52) U.S. Cl.
CPC .................. *F21V 9/16* (2013.01); *C03C 4/02* (2013.01); *C03C 10/0027* (2013.01);
(Continued)

(58) Field of Classification Search
CPC .......... F21V 9/16; F21V 9/08; F21V 33/0044; H01L 33/502; C03C 10/0027; C03C 4/02;
(Continued)

(56) References Cited

U.S. PATENT DOCUMENTS

2013/0070451 A1   3/2013   Mulet et al.
2013/0098903 A1   4/2013   Di Giovanni et al.
(Continued)

FOREIGN PATENT DOCUMENTS

DE   102010061123 A1   6/2012
WO   2011/089327 A1   7/2011
WO   2012/001300 A1   1/2012

OTHER PUBLICATIONS

International Search Report issued Jan. 21, 2014 in PCT/FR2013/052719 filed Nov. 13, 2013.

*Primary Examiner* — Thomas M Sember
(74) *Attorney, Agent, or Firm* — Oblon, McClelland, Maier & Neustadt, L.L.P.

(57) ABSTRACT

The present invention relates to an article having at least one luminous area, particularly for display purposes, particularly a white area, said article comprising at least one glass-ceramic substrate having a light transmission from 0.8% to 40% and an optical transmission of at least 0.10, at least at a wavelength within the range from 420 to 780 nm, at least one light source, particularly a light-emitting diode, having an emission peak at a wavelength between 430 and 490 nm, and at least one luminescent compound emitting in the area of the CIExyY (1931) three-color diagram delimited by the following coordinates (x, y):

| x | 0.2658 | 0.2000 | 0.3000 | 0.4229 | 0.2658 |
| y | 0.7243 | 0.3950 | 0.3405 | 0.5756 | 0.7243 | so as to form at least one luminous area, particularly a white area, in particular for display purposes, in at least one area of the plate.

19 Claims, 3 Drawing Sheets

(51) Int. Cl.
  *C03C 4/02* (2006.01)
  *C09K 11/02* (2006.01)
  *F21V 9/08* (2006.01)
  *F21V 33/00* (2006.01)
  *F24C 7/04* (2006.01)
  *G02B 27/00* (2006.01)
  *H01L 33/50* (2010.01)
  *F21W 131/307* (2006.01)

(52) U.S. Cl.
  CPC ............... *C09K 11/02* (2013.01); *F21V 9/08* (2013.01); *F21V 33/0044* (2013.01); *F24C 7/043* (2013.01); *G02B 27/0012* (2013.01); *C03C 2204/00* (2013.01); *F21W 2131/307* (2013.01); *H01L 33/502* (2013.01)

(58) Field of Classification Search
  CPC ..... C03C 2204/00; C09K 11/02; F24C 7/043; G02B 27/0012
  See application file for complete search history.

(56) References Cited

U.S. PATENT DOCUMENTS

| | | |
|---|---|---|
| 2013/0286630 A1 | 10/2013 | Guiset et al. |
| 2014/0146530 A1 | 5/2014 | Guiset et al. |
| 2015/0219312 A1 | 8/2015 | Llaluet et al. |

GLASS-CERAMIC ARTICLE WITH LUMINOUS DISPLAY

CROSS-REFERENCE TO RELATED APPLICATIONS

The present application is a 35 U.S.C. §371 national stage patent application of International patent application PCT/FR2013/052719, filed on Nov. 13, 2013, the text of which is incorporated by reference, and claims the benefit of the filing date of French application no. 1260827, filed on Nov. 14, 2012, the text of which is also incorporated by reference.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF THE MATERIAL ON THE COMPACT DISC

Not Applicable.

BACKGROUND OF THE INVENTION

Field of the Invention

The present invention relates to the field of glass-ceramics. More specifically, it relates to a glass-ceramic article (or product), notably a glass-ceramic plate, intended, in particular, to cover or accommodate heating elements, said article being provided with a colored luminous display (or at least one colored luminous/illuminated area) in at least one chosen area of the article.

Description of the Related Art Including Information Disclosed Under 37 CFR 1.97 and 1.98

The sales of articles such as glass-ceramic cooktops have been steadily increasing for a number of years. This success is due, notably, to the attractive appearance of these plates and their ease of cleaning.

Let us remind that the starting material for a glass-ceramic is a glass, designated by precursor glass (or mother glass, or green glass), the specific chemical composition of which allows to provoke controlled crystallization by suitable heat treatments known as ceramization. This special partly crystallized structure imparts unique properties to the glass-ceramic.

There exists at present different types of glass-ceramic plates, each variant being the result of considerable research and numerous experiments, since it is extremely difficult to modify these plates and/or their production process without risking an unfavorable effect on the looked for properties: in order to be used as a cooktop, a glass-ceramic plate must generally present a transmission in the visible range wavelengths which is low enough to mask at least part of the underlying heating elements when they are inactive, while also being sufficiently high so that, depending on the situations (radiant heating, induction heating, etc.), the user can visually detect the heating elements when active in the interests of safety; at the same time, it must provide high transmission in the infrared range wavelengths, notably in the case of plates with radiant heating elements.

The most common plates at the present time are dark in color, particularly black, and are colored, for example, by using vanadium oxide added to the raw materials of the mother glass before melting, this oxide imparting a sustained orange-brown tint after ceramization, due to reduction of the vanadium. Other coloring agents, such as oxides of cobalt and manganese, can also be used. With a low transmission coefficient of less than 600 nm, these plates mostly allows to view red elements such as heating elements raised to a high temperature or luminous displays based on red monochromatic light-emitting diodes. There are also more transparent glass-ceramic plates (such as the KeraVision or KeraResin glass-ceramic marketed by the EuroKera company) existing, and which allow the display of other "pure" colors (produced by monochromatic diodes), such as blue or green.

There has nevertheless appeared recently the need to be able to display a greater variety of displays with more varied colors, and, in particular, with synthetic colors produced by mixtures of a plurality of wavelengths (as in the case of the white color). Since the transmission coefficient of glass-ceramic plates is not uniform over the whole visible spectrum, the relative amplitudes of the different (spectral) components of the transmitted light are yet generally modified, and the color after transmission may differ greatly from that produced by the source.

In particular, technologies based on light-emitting diodes (LEDs) which are commonly used to produce white light (for example, with a blue light source covered with an element absorbing part of said light and re-emitting yellow light) cannot be used to produce a white color through a glass-ceramic. While the balance between the blue and the yellow is initially such that their mixture produces a visual sensation of a white color, then, because of the passage through the glass-ceramic, the absorption not being uniform (blue is strongly absorbed, and yellow less absorbed), the eye does not perceive anymore white through the glass-ceramic, but perceives, for example, pink, orange or red.

Similarly, the use of LEDs with polychromatic emission (for example, those formed by three monochromatic sources having independently adjusted intensities, such as LEDs of the "RGB" type with three sources: red, green and blue) to provide, for example, white, is not appropriate, the non-uniform absorption of the glass-ceramic in the visible range disrupting the balance between the colors and producing as well a pink, orange or red appearance. The respective intensities of the RGB components can be adjusted, but the mixture must be perfect (notably in spatial terms—good coverage of the light beams—and in temporal terms—same phase of a possible amplitude modulation of the beams notably,) to avoid non-uniformities; the spacing of the three emission areas often leads to poor mixing, resulting in a non-uniform color. Similarly, the three R, G and B chips are subject to different thermal drifts and aging, allowing colorimetric non-uniformity to develop over time. Furthermore, color variations between one RGB LED and the next are also observed, depending on the manufacturing batches of the red, green and blue LEDs. RGB LEDs are also more bulky than the LEDs normally used for display units, and are harder to integrate into a control panel.

For these reasons, displays in white or in most colors other than red, particularly in synthetic colors, are not found in glass-ceramics, notably with dark or colored glass-ceramics, because of their non-uniform absorption in the visible range, a non-monochromatic light passing through them having its color modified, this being all the more critical as its spectrum is wide, as in the case of white sources.

BRIEF SUMMARY OF THE INVENTION

The aim of the present invention has been therefore to provide new improved glass-ceramic articles (such as plates), and in particular to develop new glass-ceramic articles having a more varied colored luminous display, notably in colors other than red, particularly white, this display not presenting the aforementioned drawbacks, offering a range of precise colors, and being particularly, and advantageously, applicable to plates which have a dark color and/or are highly absorbent and/or are themselves colored.

DETAILED DESCRIPTION OF THE INVENTION

Figure 1:
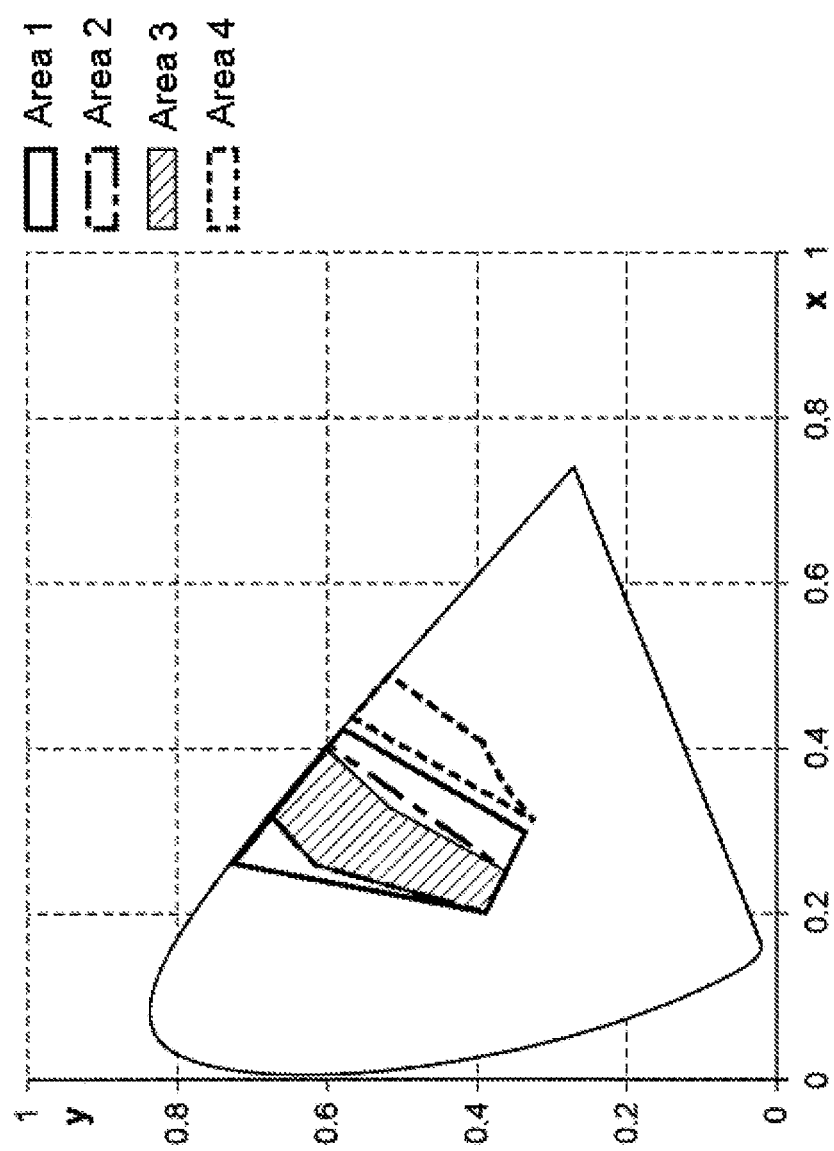
FIG. 1: A CIE 1931 colorimetric diagram illustrating the emission areas of the luminescent compound according to the invention that enables the production of a white color through the glass-ceramic according to the invention.
Figure 2:
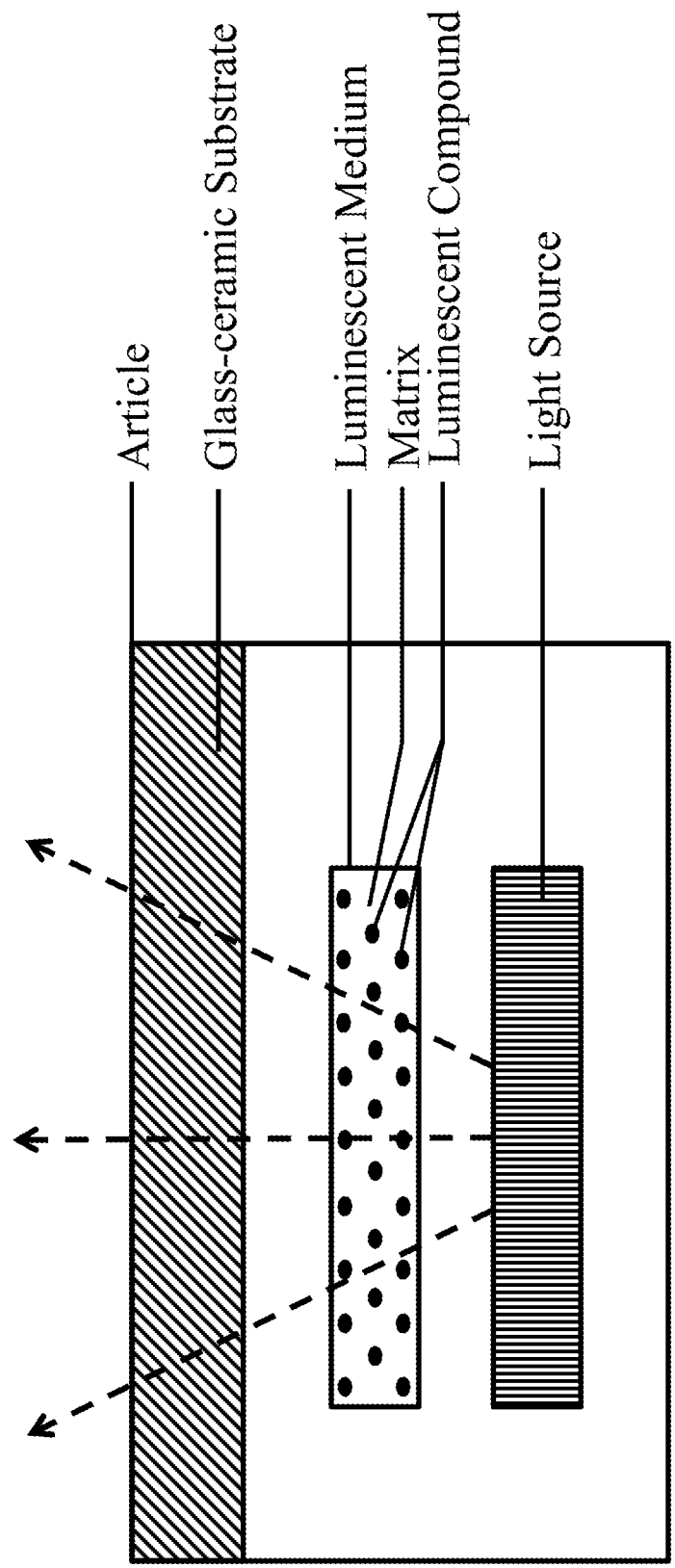
FIG. 2: An article according to the invention that includes: a glass-ceramic substrate; a light source; and a luminescent compound in a luminescent medium.
Figure 3:
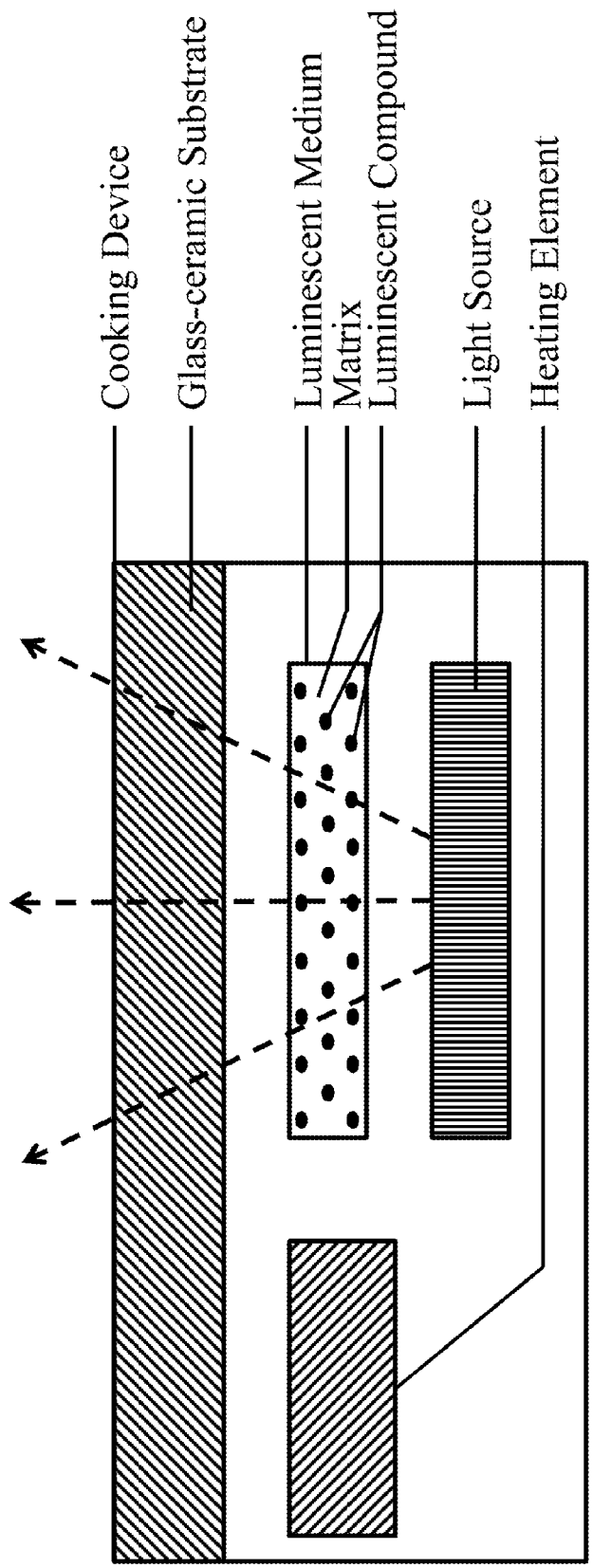
FIG. 3: A cooking device according to the invention that includes: a glass-ceramic substrate; a light source; a luminescent compound in a luminescent medium; and a heating element.

This aim is achieved by the new article according to the invention, which has at least one colored luminous area (particularly for display purposes), in particular white, said article comprising at least one glass-ceramic substrate (in particular a plate, intended for example to cover or accommodate at least one heating element) having a light transmission from 0.8% to 40% and an optical transmission of at least 0.1% for at least a wavelength within the range from 420 to 780 nm (in the visible range), at least one light source (and/or a display unit incorporating said source), particularly a light-emitting diode (LED), having an emission peak at a wavelength between 430 and 490 nm (preferably between 440 and 485 nm), and at least one luminescent (or "phosphor", particularly and preferably a fluorescent compound) compound (or substance or matter or material) emitting in the area (of the CIExyY (1931) three-color diagram) delimited by the following (colorimetric) coordinates (x, y) (this area being termed area 1 when appropriate):

| x | 0.2658 | 0.2000 | 0.3000 | 0.4229 | 0.2658 |
|---|---|---|---|---|---|
| y | 0.7243 | 0.3950 | 0.3405 | 0.5756 | 0.7243 | said compound being coupled (in operation) to said source (as well as to the plate, the obtained colored area resulting, notably, from (the action/effect of) these three components), so as to form, in particular, at least one luminous area, notably a display (data visualization and/or signalization, or decorative patterns, for example) which is colored, in particular white, in at least one area of the plate. As explained below, this compound (generally in the form of a layer) can be notably combined (in terms of positioning) with the source and/or the plate.

The aforementioned coordinates (x, y) of the CIE 1931 colorimetric system (International Commission on Illumination, 1931) for specifying the emission of the luminescent compound are measured by spectrofluorometer (spectrophotometer analyzing the fluorescence of a specimen) measuring the emission spectrum of the compound, the measurement being made by exciting the compound at the wavelength of the main peak of the light source used according to the invention, the coordinates (x, y) of the CIE 1931 model being subsequently observed from this spectrum according to the ISO 11664-3:2012 standard.

Preferably, the luminescent compound selected according to the invention is a compound emitting in the area of the CIExyY (1931) three-color diagram delimited by the following coordinates (x, y) (this area being termed area 2 when appropriate):

| x | 0.3231 | 0.2702 | 0.2000 | 0.2550 | 0.3600 | 0.4087 | 0.3231 |
|---|---|---|---|---|---|---|---|
| y | 0.6722 | 0.6158 | 0.3950 | 0.3650 | 0.5300 | 0.5896 | 0.6722 | and, particularly preferably, is a compound emitting in the area of the CIExyY (1931) three-color diagram delimited by the following coordinates (x, y) (this area being termed area 3 when appropriate):

| x | 0.3231 | 0.2702 | 0.2000 | 0.2550 | 0.3451 | 0.3980 | 0.3231 |
|---|---|---|---|---|---|---|---|
| y | 0.6722 | 0.6158 | 0.3950 | 0.3650 | 0.5437 | 0.6001 | 0.6722 |

Particularly preferably, this luminescent compound further has an emission peak at a wavelength between 500 and 575 nm (and preferably below 570 nm, particularly below 560 nm) with a mid-height width between 50 and 145 nm (and preferably below 140 nm, particularly below 125 nm).

According to the present invention, the light source (or luminous source or source of illumination), particularly the light-emitting diode, as chosen, emits a radiation characterized by a peak (at least one main or majority or of maximum intensity peak) in the range of wavelengths between 430 and 490 nm (corresponding to a blue color), directed toward a portion of the glass-ceramic substrate, this radiation being absorbed to a greater or lesser degree by the chosen luminescent compound associated (notably by deposition on the source or by deposition on the glass-ceramic substrate on the radiation path) with said source, said chosen luminescent compound (re)emitting a light corresponding essentially to a green color, or possibly a blue-green color, as it appears in the CIExyY (1931) three-color diagram, and resulting, in combination with the blue light emitted by the source and transmitted by the luminescent medium (formed from the luminescent compound and, when appropriate, from the binder or matrix incorporating this compound), and after passing through the glass-ceramic substrate having the characteristics as defined in the invention, in the illumination of a portion of said substrate in a specific color range other than red, in particular in a white range as preferably looked for according to the invention, this white range having the following colorimetric coordinates (x, y) (in the CIExyY (1931) three-color diagram):

| x | 0.4791 | 0.3983 | 0.3382 | 0.2668 | 0.2810 | 0.3523 | 0.4124 | 0.4932 | 0.4791 |
|---|---|---|---|---|---|---|---|---|---|
| y | 0.4217 | 0.3979 | 0.3590 | 0.2877 | 0.2735 | 0.3449 | 0.3838 | 0.4076 | 0.4217 |

(or white range corresponding to a blackbody between 2500 K and 10500 K, the article according to the invention using one or more luminescent compounds (of area 1) as defined by the invention enabling advantageously the obtaining of luminous areas in such a white range).

Particularly preferably, this white range has the following colorimetric coordinates (x, y):

| x | 0.4039 | 0.3381 | 0.2801 | 0.2942 | 0.3523 | 0.4181 | 0.4039 |
| y | 0.4005 | 0.3589 | 0.3032 | 0.2891 | 0.3448 | 0.3864 | 0.4005 |

(or white range corresponding to a blackbody between 3500 K and 8500 K, the article according to the invention using one or more luminescent compounds of area 2 enabling advantageously the obtaining of luminous areas in such a white range), and in particular it advantageously has the following colorimetric coordinates (x, y):

| x | 0.3409 | 0.3001 | 0.2800 | 0.2942 | 0.3142 | 0.3550 | 0.3409 |
| y | 0.3609 | 0.3245 | 0.3031 | 0.2889 | 0.3104 | 0.3468 | 0.3609 |

(or white range corresponding to a blackbody between 5000 K and 8500 K, the article according to the invention using one or more luminescent compounds of area 3 enabling advantageously the obtaining of luminous areas in such a white range).

Advantageously, the chosen light source according to the invention is a monochromatic (pure color) source; in other words, (the emission spectrum of) the source (giving the luminous intensity emitted as a function of the wavelength) has a single emission peak in the visible wavelength range. Furthermore, the width of the (main or single) peak of the source advantageously varies from 1 to 100 nm, preferably from 5 to 50 nm.

Also advantageously, the chosen luminescent compound according to the invention has a single emission peak, the wavelength of the (main or single) peak being between 500 and 575 nm, and preferably being below 570 nm, particularly below 560 nm, the mid-height width of the peak being between 50 and 145 nm and preferably being below 140 nm, particularly below 125 nm.

The luminescent compound is generally based on at least a material which is organic or advantageously mineral, and is embedded (or incorporated) in a resin or medium or matrix allowing its application, the whole assembly generally taking the form of a film or layer or small slab (layer made separately, in a mold for example, and which can be added on later on), etc., and the resin being advantageously (semi-)transparent (particularly transparent or partially diffusing) and having preferably a light transmission (measured according to the ISO 9050:2003 standard for example by spectrophotometry) of at least 50%, notably at least 80%, and in particular at least 90% in the visible range. The action of this compound/the assembly (or luminescent medium) on the light transmission takes place by absorption of a certain part of the incident light at certain wavelengths, the absorbed light being re-emitted (at least partially, and possibly totally) at other wavelengths. The compound/the assembly can be added on (manufactured separately) and combined, notably, with the light source (or with a plurality of light sources) and/or with the glass-ceramic substrate, or it can be integrated with or formed directly on the glass-ceramic substrate and/or possibly on at least one light source and/or an intermediate element, as explained later on. At least one light source chosen according to the invention is coupled (in operation) to at least such a corrective compound (in other words, its emitted radiation passes through said compound) in order to produce the desired display through the glass-ceramic substrate with which this assembly source/luminescent compound is combined.

Preferably, according to the invention, the luminescent compound is chosen in accordance with the light source, so that the portion of light emitted by the source and transmitted through the luminescent compound has the following colorimetric coordinates (x, y) (in the CIExyY (1931) three-color diagram) (or so that the assembly source/luminescent compound emits in the area of the CIExyY (1931) three-color diagram delimited by the following coordinates (x, y)):

| x | 0.460 | 0.385 | 0.255 | 0.190 | 0.175 | 0.180 | 0.305 | 0.385 | 0.460 |
| y | 0.440 | 0.425 | 0.305 | 0.255 | 0.270 | 0.310 | 0.485 | 0.510 | 0.440 | so as to obtain through the substrate chosen according to the invention a white-colored area (particularly the white color corresponding to the blackbody between 2500 K and 10500 K as defined above), as is preferably looked for according to the invention.

Particularly preferably, this compound is chosen with regard to the light source, so that the portion of light emitted by the source and transmitted through the luminescent compound has the following colorimetric coordinates (x, y):

| x | 0.305 | 0.180 | 0.180 | 0.200 | 0.235 | 0.265 | 0.330 | 0.385 | 0.305 |
| Y | 0.485 | 0.310 | 0.280 | 0.265 | 0.330 | 0.315 | 0.380 | 0.425 | 0.485 | so as to obtain through the substrate chosen according to the invention a preferred white-colored area (particularly the white color corresponding to the blackbody between 3500 K and 8500 K as defined above).

In particular, the luminescent compound is chosen so that the portion of light emitted by the source and transmitted through the luminescent compound has the following colorimetric coordinates (x, y):

| x | 0.260 | 0.180 | 0.200 | 0.235 | 0.265 | 0.330 | 0.260 |
| y | 0.420 | 0.280 | 0.265 | 0.330 | 0.315 | 0.380 | 0.420 | so as to obtain through the substrate chosen according to the invention a particularly preferred white-colored area (particularly the white color corresponding to the blackbody between 5000 K and 8500 K as defined above).

In order to obtain a color having precise given coordinates (particularly a white of the warm or cold white type, with fixed coordinates) through a given glass-ceramic as defined according to the invention, luminescent compound according to the invention the most appropriate out of those selected, and the appropriate quantity of this compound, are chosen and calculated, as a function of the glass-ceramic (in this case as a function of the optical transmission—or spectral transmission or spectral dispersion—of the glass-ceramic substrate, the optical/spectral transmission itself depending on the composition and thickness of said substrate), of the matrix in which the compound is incorporated when appropriate, and of the precise light source used, as explained later on.

The glass-ceramic article according to the invention and its components are more fully detailed in the remainder of the description.

The term "glass-ceramic articles" means not only articles made from glass-ceramics proper, but also articles made from any other similar material suitable for the same applications (for example a glass, which may or may not be reinforced), particularly a material resistant to high temperatures and/or having, notably, a zero or nearly zero expansion coefficient (for example below $15 \times 10^{-7}$ $K^{-1}$, as in the case of glass-ceramic plates used with radiant heating elements). Preferably, however, the article is a glass-ceramic article proper.

The article according to the invention may advantageously be a cooktop, but may also be any other glass-ceramic article having a functional or decorative display, or an article or module or assembly or system (primarily intended) for display (decorative and/or functional) with at least one light source coupled to at least one corrective compound as defined according to the invention, this assembly being coupled to at least one glass-ceramic, particularly a plate, according to the invention.

Preferably, the article according to the invention is formed (as a substrate) by a glass-ceramic plate (having a thickness generally within the range from 3 to 4 mm, notably about 4 mm), which is flat, or mostly or nearly flat (particularly with a deflection less than 0.10 of the diagonal of the plate, and preferably approximately equal to zero), and is intended for use as a cooktop. A plate of this type is generally intended to be integrated into a cooktop or cooker comprising said plate and heating elements, for example radiant or halogen elements or induction heating elements.

The plate generally has an "upper" face (the visible face) in the position of use, another "lower" face (often concealed, in the frame or body of a cooker for example) in the position of use, and an edge (or thickness or side). The upper face is generally flat and smooth, but may have at least one relief area and/or at least one recessed area and/or at least one opening (for example, if the plate incorporates an opening intended to receive an atmospheric gas burner). The lower face may be, notably, smooth or provided with projections which increase its mechanical strength and which are produced for example by lamination. When appropriate, when projections are present, an index resin may be applied on the lower surface in order to smooth it, if necessary.

The article according to the invention is advantageously based on any glass-ceramic which intrinsically has a light transmission in the range from 0.8% to 40% (particularly from 2.3 to 40%) and an optical transmission (determined in a known way by making the ratio between the transmitted intensity and the incident intensity at a given wavelength) of at least 0.1% for at least one wavelength, within the visible range, above 420 nm (and up to 780 nm), and preferably equal to at least 0.1% for all the wavelengths within the range from 420 to 780 nm. The expression "intrinsically" means that the plate has this transmission in itself, without the presence of any coating. The light transmission is measured according to ISO 9050:2003 standard (which also mentions the optical transmission) by using the D65 illuminant, and is the total transmission (notably integrated into the visible range and moderated/weighted by the sensitivity curve of the human eye), both taking into account the direct transmission and any diffuse transmission, the measurement being made, for example, by means of a spectrophotometer equipped with an integrating sphere, the measurement at a given thickness being subsequently converted, when appropriate, to the reference thickness of 4 mm according to ISO 9050:2003 standard. The invention can be applied particularly advantageously to dark plates, notably those of black or brown appearance, having such transmission properties, but the glass-ceramic with these properties that is used can also be a clear glass-ceramic, the solution according to the invention allowing a luminous display of the precise desired color to be obtained, with great flexibility of adaptation, for this whole range of plates, in a simple way and without any risk of affecting other properties of the plates.

In a first embodiment, the glass-ceramic is a glass-ceramic, in particular dark (notably such that the value of L* in the CIE colorimetric system, calculated from the transmission spectrum of said glass-ceramic in the visible range, is less than 70%), having a light transmission in the visible range of 0.8% to 5%, in particular of 0.8% to 2.5%, and having an optical transmission greater than 0.1% for at least one wavelength in the visible range above 450 nm.

In another advantageous embodiment, the glass-ceramic, of the lithium aluminosilicate type, has (intrinsically) a light transmission from 2.3% to 40%, in particular above 2.5%, notably above 3.5%, and an optical transmission of at least 0.6% for at least one wavelength within the range from 420 to 480 nm. In this case, whether the glass-ceramic is clear or dark, it preferably has at least one masking means intended to mask at least a part of the associated underlying elements (notably the heating elements), with the exclusion, when appropriate, of the light-emitting devices/lighting areas, and, when appropriate, of radiant heating means, the light sources and luminescent compound(s) according to the invention being essentially used in this case in non-masked luminous areas.

In particular, use is advantageously made of a glass-ceramic comprising the following components, and/or obtained by ceramization from a glass having the following composition, within the limits shown below in percentages by weight: $SiO_2$: 52-75%; $Al_2O_3$: 18-27%; $Li_2O$: 2.5-5.5%; $K_2O$: 0-3%; $Na_2O$: 0-3%; ZnO: 0-3.5%; MgO: 0-3%; CaO: 0-2.5%; BaO: 0-3.5%; SrO: 0-2%; $TiO_2$: 1.2-5.5%; $ZrO_2$: 0-3%; $P_2O_5$: 0-8%, and preferably within the limits shown below as percentages by weight: $SiO_2$: 64-70%; $Al_2O_3$: 18-21%; $Li_2O$: 2.5-3.9%; $K_2O$: 0-1.0%; $Na_2O$: 0-1.0%; ZnO: 1.2-2.8%; MgO: 0.20-1.5%; CaO: 0-1%; BaO: 0-3%; SrO: 0-1.4%; $TiO_2$: 1.8-3.20; $ZrO_2$: 1.0-2.5%.

The glass-ceramic can also comprise up to 1% by weight of non-essential components which do not affect notably the melting of the mother glass or the further devitrification leading to the glass-ceramic. In particular, coloring agents may be added to the composition in limited proportions (preferably in proportions of less than 0.20, particularly less than 0.15%, for the sum of the coloring agents), for example in the case of black or brown glass-ceramics. For example, the composition of the plate may advantageously comprise vanadium oxide ($V_2O_5$) in a proportion between 0.005% and 0.2%, notably between 0.01% and 0.2%, particularly between 0.01% and 0.1%, and preferably below or equal to 0.05% or possibly to 0.04%. The preferred vanadium oxide content is between 0.01% and 0.03%.

The glass-ceramic can also contain, for concealing the heating elements, and in combination with vanadium oxide when appropriate, the other following coloring agents within the following limits by weight (the glass-ceramic substrate preferably comprising less than 0.2%, particularly less than 0.15%, of coloring agents, as mentioned above): $Fe_2O_3$: 0-0.2%; CoO: 0-1%, preferably 0-0.12%, and particularly 0.01-0.04% ($Fe_2O_3$, $V_2O_5$ and CoO being the coloring agents preferably used), or even NiO (particularly in a proportion of less than 0.005%, this compound generally being present as an impurity), CuO (particularly in a proportion of less than 0.005%, this compound generally being present as an impurity) and/or MnO (preferably in a proportion of less than 0.05%, particularly less than 0.025%). The glass-ceramic can also comprise other coloring agents in limited proportions, in particular, it can comprise less than 1000 ppm (0-0.1%) of $Rb_2O$, generally present as an impurity, or less than 1000 ppm (0-0.1%) of the sum of the following oxides: $As_2O_3+Sb_2O_3$, the glass-ceramic being preferably free from the agents $P_2O_5$, $B_2O_3$ and F. In order to obtain, in particular, a white luminous area such as advantageously looked for according to the present invention, the glass-ceramic of the article according to the invention also preferably has a proportion of $Cr_2O_3$ of less than 0.0015% (or proportion from 0 to 0.0015%), in particular below 0.0012% or or even below or equal 0.001% by weight.

The glass-ceramic can also comprise tin oxide (or other reducing agents such as metal sulfides) in a proportion of less than 0.5% (or 0-0.50), tin oxide ($SnO_2$) enabling to promote the reduction of the vanadium during the ceramization step, notably causing the appearance of the color.

The preferred dark glass-ceramic according to the invention generally comprises β-quartz structure crystals within a residual vitreous glass phase, and the absolute value of its coefficient of expansion is advantageously not more than $15\times10^{-7}/°$ C., or even not more than $5\times10^{-7}/°$ C.

By the selection of glass-ceramics which, although they may be dark in some cases, present selected light and optical transmission properties as described above, and their combination with the selected lighting means (source(s) and luminescent compound(s)), in order to provide controlled compensation or correction of the spectral dispersion of the glass-ceramics, the desired white appearance can be obtained. The invention is suitable for dark or colored glass-ceramic plates meeting the transmission criteria, to which it gives a function of providing controlled coloring of the display.

The article according to the invention comprises at least one light source as defined according to the invention, but it may also comprise a plurality of sources when appropriate (the number and arrangement of which may vary to make the illumination uniform). The source or sources can be integrated into and/or coupled to one or more structures of the display unit type (for example such as "7 segment" displays with light-emitting diodes), or to an electronic control panel with touch keys and digital display, etc. As mentioned above, the light sources are advantageously formed by light-emitting diodes, spaced apart to a greater or lesser extent, possibly associated with one or more optical guides as mentioned below. The diodes are advantageous in the present invention, notably due to their overall dimensions, efficiency, durability and resistance to environmental conditions (heat, etc.).

The diodes may be encapsulated; in other words, they may comprise a semiconductor component and an envelope (for example made of epoxy, nylon, or silicone type resin(s)), encapsulating the semiconductor component. The diodes may also be semiconductor chips without collimating lenses, for example in sizes of about a hundred μm or of about a mm, possibly with minimum encapsulation (for protective purposes, for example).

The diodes may be held on a support, bar or base, this base having a (flat or inclined) surface which is treated and/or made reflective for greater luminous efficiency, for example being coated with a varnish or paint and/or a mirror layer, and/or being coupled to a white or metallic reflector for better guidance of the emitted radiation.

The source or sources can be mounted (on the plate or on another component of the article, such as the control panel) by soldering, clipping, gluing, etc., using when appropriate another intermediate element; for example, the diodes can be mounted soldered onto a support which is itself housed inside a metal structural section, and then mounted by clipping or gluing the structural section. The positioning of the source or sources (notably with respect to the plate) is adapted to provide a display through the glass-ceramic.

The sources, as well as their power supply and their operation may or may not be separated from one another, so as to allow simultaneous or separate illumination of the desired illumination areas according to requirements.

Notably, the sources used can be LEDs manufactured, for example, from a chip of semiconductor crystal such as gallium/indium nitride (InGaN) emitting in the blue range. Advantageous examples of LEDs that may be mentioned include, notably, the following LEDs or display units: the VLMB1300-GS08 reference made by Vishay company, the KPT-1608QBC-G, APG1608QBC/F, or SA39-11PBWA references made by KingBright company, the LB Q39G-N1P1-1 reference made by Osram company, the LCS-10012TB11 reference made by LC LED company, etc. It should be noted that LED display units are luminous display devices whose "primary" light source is formed by LED(s), these devices generally being composed of luminous "segments" (for example 7-segment display units), dots (matrix display units) or bars, one segment generally being formed by a reflector, and the LED or LEDs generally being inserted at one end of the reflector and the light being guided to the other (apparent) end, the internal walls of the reflector possibly being diffusing and/or the apparent end of the segment possibly being covered with a high-transparency plastic material.

As already mentioned, the article may comprise, in addition to the source or sources, at least one waveguide intended to propagate the light from one part of the article to another (in particular, by internal total reflection or by metallic reflection), the light source then being attached to the guide and interacting with it by emitting its light radiation into it, so that the guide transmits this radiation, the light source or sources emitting/being coupled for example through the side or edge of the guide. This guide is advantageously clear or transparent, and is generally added on (assembled after being made separately) on the lower face of the substrate. It can be organic and/or plastic (for example, of polycarbonate or poly(methyl methacrylate) (PMMA)), or mineral, and it is preferably mineral; in particular, it is a glass. The article according to the invention may comprise a plurality of guides, each dedicated to one or more areas of illumination, or a unitary guide, provided with openings when appropriate. The guide can be fixed to the substrate by gluing and/or clipping, or by encapsulation, etc. The guide can be mounted directly on the substrate or on another part of the article or of a support on which the article is mounted, for example, in the case of a cooking module or apparatus, the guide can be fixed to the frame/casing of the cooking apparatus on which the substrate is mounted (this frame/casing possibly forming part of the article when appropriate). Among other effects, the guide enables the light to be conveyed more effectively to the desired areas of illumination, particularly if the substrate is dark in color.

The article according to the invention can also comprise, in the area of illumination, at least one means of extracting the radiation (emitted by the source or sources and conducted when appropriate by the waveguide), for example one or more diffusing elements or treatments, in particular an extraction means such as a layer added on the surface and/or any treatment or differential texturing of the surface (locally or over the whole surface) for example of the waveguide, such as laser engraving, enamel printing, chemical etching (acid . . . ) or mechanical etching (sandblasting . . . ), etc., the extraction means possibly being formed wholly or partially by the luminescent medium associated with the light source (for example in the case in which diffusing particles are added to the binder incorporating the luminescent compound according to the invention). An extraction surface may also be provided, for example in the thickness of the guide when appropriate, for example by means of an internal etching method by laser. The extraction mean(s) enable the radiation to be extracted from the guide toward the desired area of illumination. When appropriate, the geometry and roughness of the edge of a waveguide can also be machined to allow local and controlled extraction of the light. The extraction mean(s) can be combined, when appropriate, with another treatment allowing to target the areas of illumination, for example with masking screen printing (masking certain areas and preventing the passage of light) on the substrate. As defined according to the invention, the source or sources used are combined with a luminescent compound through which the radiation(s) emitted by the source or sources passe(s) (transmitted, when appropriate, by the waveguide and any extraction means present). This compound is generally placed (and, in particular, occupies a fixed position) between the source and the substrate and may be fixed (that is to say directly or indirectly (for example by means of another component), and unmovable/not movable simply once in place) to the source and/or to the substrate, and/or possibly to another intermediate element (for example a light extraction means as mentioned above).

This compound is generally incorporated (in particular by mixing, for example by using an agitator, before any possible baking or hardening of the mixture) in a matrix or resin or binder as already mentioned, which may be organic (or polymeric) or inorganic, preferably transparent, and possibly diffusing, for example an acrylate, epoxy or silicone binder (or resin), or sol-gel, etc., for example a resin of Sylgard 184 Silicone Elastomer or OE-6635 references made by Dow Corning company, etc. The luminescent compound can be an organic, or preferably inorganic, compound, possibly doped when appropriate (for example a europium-doped aluminate or silicate), and is preferably a fluorescent compound (which emits light immediately after excitation). It is preferably a single compound (preferably having a single emission peak), deposited in the form of a layer, but it is also possible, when appropriate, to use a plurality of compounds (the resulting mixture having the characteristics of the luminescent compound such as selected according to the present invention) and/or a plurality of layers of superimposed or combined compounds.

The compound (in its binder, if present) is generally deposited in the form of one or more layers (generally from several tens to several hundreds of microns in thickness), for example by roller application, spraying, spin coating, screen printing, inkjet printing, or the like, and is fixed (directly or, for example, by the addition of adhesive if necessary, notably if it is deposited on or incorporated in an intermediate element and then added on) on the surface, notably, of the source or sources or of the glass-ceramic.

In a first advantageous embodiment, it is deposited on (or mounted on) and fixed to (or fastened onto) the light source. Preferably, the deposition is limited to the emitting surface of the chip and is of constant thickness so as to ensure that the color of the emitted light remains uniform depending on the angle of observation (this is known as conform deposition).

In a second advantageous embodiment, the compound (in its binder, if present) is deposited on and fixed to (or fastened onto) the glass-ceramic, preferably the lower face of the glass-ceramic.

Preferably, the luminescent medium (compound selected according to the invention, and the matrix or binder incorporating it when appropriate) has an absorbance $A_\lambda$ greater than 0.274, and preferably greater than 0.297 at the emission wavelength $\lambda$ (of the main or single peak) of the source used with which it is combined. The absorbance $A_\lambda = \log_{10}(I_0/I)$, where $I_0$ is the incident luminous intensity and $I$ is the transmitted luminous intensity, and is measured with a spectrophotometer.

As mentioned above, the choice of the compound for obtaining the desired target color (as perceived visually) is a function of the glass-ceramic plate used, the binder or matrix incorporating the compound, the looked for color and the source used. In particular, so as to obtain a color (advantageously white) having given colorimetric coordinates or within a given range, it is proceeded as follows:
1) The target color or colors are placed in the CIExyY (1931) three-color diagram,
2) The point $(x_s, y_s)$ corresponding to the chosen source (selected according to the invention) seen through the glass-ceramic substrate is placed in the CIExyY (1931) three-color diagram (the emission spectrum of the source is measured after transmission by the glass-ceramic, according to CIE 127-2007 standard, then the associated coordinates (x, y) of the CIE 1931 model are calculated according to ISO 11664-3:2012 standard),
3) The point $(x_l, y_l)$ corresponding to the selected luminescent medium (the luminescent compound as defined according to the invention and the matrix incorporating it, when appropriate) seen through the glass-ceramic plate is placed in the CIExyY (1931) three-color diagram,
4) The set of colors that can be synthesized by this combination corresponds to the straight line linking the points placed on the diagram in steps 2) and 3). If this straight line cuts the point or the area of points defined in step 1) (at a distance of less than 0.01, preferably less than 0.001, or even zero), this combination of source and luminescent medium is accepted, and the procedure moves to step 5) for the determination of the amount of luminescent compound to use. Otherwise, the procedure restarts from step 3) with a different luminescent compound selected according to the invention, until the straight line that is drawn cuts the point or the area of points defined in step 1) and it is thus possible to select the most appropriate luminescent compound (and the medium incorporating it, when present/appropriate) for obtaining the target color.
5) The coordinates $(x_c, y_c)$ of the point of intersection (which minimizes the distance to the target) found in step 4) are noted. This point of intersection is the barycentre of the points defined in steps 2) and 3), to which coefficients $\alpha$ and $\beta$ are assigned such that $\alpha=(x_c-x_l)/(x_s-x_l)$ and $\beta=(x_c-x_s)/(x_l-x_s)$. The amount of luminescent compound to be used must be such that, for a total luminous intensity $(I_t)$ emitted by the source (measured according to CIE 127-2007 standard), the light originating from the source provides a contribution of $\alpha \times I_t$, and the light originating from the luminescent compound provides a contribution of $\beta \times I_t$. Thus this amount is determined, for example, by making a plurality of depositions of the binder or matrix incorporating the luminescent compound while varying the concentration of said compound and/or the thickness (of the luminescent medium) deposited, and then selecting the specimen which enables the point of the desired color to be reached through the glass-ceramic, or else by measuring the emission spectrum of the specimens, calculating the ratio between the peak luminous intensity of the luminescent compound and the peak luminous intensity of the source, and selecting the specimen for which this ratio is equal to $\beta/\alpha$.

The combination of the source/luminescent compound/glass-ceramic according to the invention enables a white display to be obtained through the glass-ceramic, giving access to light effects that are particularly looked for in terms of design. The article according to the invention can thus have one or more luminous areas/display areas for functional and/or decorative use (design, logo, alphanumeric indication, etc.) generally observed on the main faces (notably the upper face) of the glass-ceramic substrate. Said area or areas may be located in any area of the plate (including the heating areas), and there may be a plurality of differentiated luminous areas/display areas, with a luminance level above 10 candela/m$^2$ (value defined according to ISO 23539: 2005(E) standard), particularly more than 20 candela/m$^2$, and notably more than 50 or even 70 candela/m$^2$.

The article according to the invention can include when appropriate other elements and/or layers than the aforesaid components. For example, in the case of a cooking module, the article may be provided with (or associated with) a supplementary functional or decorative element or elements (frame, connector(s), cable(s), control element(s)), etc. It can include various functional and/or decorative coatings, based on enamel, paint, etc. For example, one of the faces of the substrate can include a layer of enamel for decoration, for masking (for example in order to prevent direct viewing of the sources), or for other purposes (for providing uniformity of illumination, etc.).

The invention also relates to apparatus (or devices) for cooking and/or for maintaining at high temperature, including at least one article according to the invention (for example, cookers, insert cooktops, ovens, and the like) and including, when appropriate, one or more heating elements such as one or more radiant or halogen elements and/or one or more atmospheric gas burners and/or one or more induction heating means. The article according to the invention can also consist in a cooking apparatus including one or more heating elements further to the elements mentioned above in the definition of the invention. The invention covers cooking apparatus including a single plate as well as apparatus including a plurality of plates, each of these plates having possibly one or more heaters. The term "heater" signifies a cooking place. The invention also relates to mixed cooking apparatus whose cooktop or cooktops include several types of heater (gas, radiant, halogen, or induction heaters). Furthermore, the invention is not limited to the manufacture of cooking plates or modules for cookers or cooktops. The articles manufactured according to the invention can also be other flat modules or plates which are required to have low sensitivity to temperature variations.

The cooking apparatus also generally comprises, further to the internal heating elements, operating and/or control means, the internal elements being covered by the glass-ceramic substrate, the display of colors other than red being seen through said substrate, provided, when appropriate, on one face or within it, with at least one masking means intended to mask at least a part of said internal elements.

The present invention also relates to a method of manufacturing an article according to the invention, in which at least one luminescent compound as mentioned previously according to the invention is inserted between the glass-ceramic plate and at least one source, this compound being, in particular, chosen according to the aforementioned selection method. This compound can be inserted in the form of an independent element (for example, the compound can be added on in its binder, having been manufactured in advance in the form of a small slab (wafer), in particular it can be mounted on the glass-ceramic substrate or on the source), or as a layer deposited on the source or the glass-ceramic substrate as mentioned above. This compound can also have been deposited in advance on the source before their addition to the glass-ceramic substrate (notably, a source already incorporating this luminescent compound can be used). This compound or the element incorporating the compound (for example, the source covered with the compound) can be advantageously inserted after the ceramization of the precursor glass (or mother glass, or green glass) to obtain the glass-ceramic substrate.

As a reminder, glass-ceramic plates are generally manufactured in the following manner: glass having a chosen composition is melted in a melting furnace to form the glass-ceramic, then the molten glass is rolled into a standard ribbon or sheet by passing the molten glass between laminating rollers, after which the glass strip is cut to the desired dimensions. The plates then cut off are then ceramized in a known way, the ceramization consisting in baking the plates according to the chosen thermal profile to transform the glass into the polycrystalline material called "glass-ceramic", whose coefficient of expansion is zero or nearly zero, and which withstands thermal shocks of up to 700° C. The ceramization generally comprises a step of progressive temperature increase up to the nucleation domain, generally located in the vicinity of the transformation domain of the glass, a step of crossing during several minutes the nucleation interval, a further progressive temperature increase up to the ceramization plateau, the maintenance of the temperature of the ceramization plateau for several minutes, and then a rapid cooling to ambient temperature. When appropriate, the process also comprises a cutting operation (generally before ceramization), using for example water jet, mechanical cutting/scoring with a cutter wheel, etc., followed by a shaping operation (grinding, beveling, etc.).

By way of illustration, FIG. 1 shows, in the CIE 1931 colorimetric diagram, the emission areas of the luminescent compound selected according to the invention which enable to obtain a white color to be produced through the glass-ceramic selected according to the invention. In particular, area 1 represents the area having the following colorimetric coordinates:

| x | 0.2658 | 0.2000 | 0.3000 | 0.4229 | 0.2658 |
| y | 0.7243 | 0.3950 | 0.3405 | 0.5756 | 0.7243 |

Area 2 represents the preferred area having the following coordinates:

| x | 0.3231 | 0.2702 | 0.2000 | 0.2550 | 0.3600 | 0.4087 | 0.3231 |
| y | 0.6722 | 0.6158 | 0.3950 | 0.3650 | 0.5300 | 0.5896 | 0.6722 |

Area 3 represents the particularly preferred area having the following coordinates:

| x | 0.3231 | 0.2702 | 0.2000 | 0.2550 | 0.3451 | 0.3980 | 0.3231 |
| y | 0.6722 | 0.6158 | 0.3950 | 0.3650 | 0.5437 | 0.6001 | 0.6722 |

For reference, area 4 represents the emission area (corresponding to a yellow color) of the luminescent elements currently used in existing white LEDs formed by a blue light source covered with an element absorbing part of said light and re-emitting yellow light, these white LEDs not allowing to produce a white color through a glass-ceramic as looked for according to the invention, the eye rather perceiving pink, orange or red in this case.

The following example further illustrates in a non-limiting way the present invention.

In this example, the article produced is a flat cooking module comprising a glass-ceramic plate (substrate), marketed by Eurokera company under the brand name KeraVision, this plate having a smooth upper face and a smooth lower face, the article further comprising a light source fixed under the plate and against the latter.

The light source used is an LED display unit, each LED having an emission peak at a wavelength of 472 nm with a mid-height width of 25 nm. Additionally, the luminescent compound used is a compound of the reference EG3560 (based on europium-doped silicate) marketed by Intematix company, having an emission peak at a wavelength of 535 nm with a mid-height width of 80 nm and the following colorimetric coordinates: x=0.345 (+/−0.005); y=0.602 (+/−0.005). This compound, in powder form, is mixed by means of a stirrer with an acrylate resin in liquid form marketed by Epotecny company under the reference NOA81, in a proportion of 1.5 g of powder of said compound per 1 ml of resin. The resulting luminescent mixture is deposited by spin-coating in a thickness of 230 μm directly on the glass-ceramic plate. In operation, the source emits a beam of light which passes through the assembly formed by the luminescent mixture/the plate, in the display area. The resulting display is white in color, and has the following colorimetric coordinates: x=0.341; y=0.365.

The articles, particularly plates, according to the invention can, notably, be used advantageously to produce a new range of cooktops for cookers or hobs, but can also be used advantageously to produce oven wall elements or walls (for example, doors or parts of doors of ovens), etc.

The invention claimed is:

1. An article, comprising:
   a glass-ceramic substrate having a light transmission from 0.8% to 40% and an optical transmission of at least 0.1% for at least a wavelength within a range from 420 to 780 nm;
   a light source having an emission peak at a wavelength between 430 and 490 nm; and
   a luminescent compound emitting in an area delimited by the following colorimetric coordinates (x, y):

| x | 0.2658 | 0.2000 | 0.3000 | 0.4229 | 0.2658 |
|---|--------|--------|--------|--------|--------|
| y | 0.7243 | 0.3950 | 0.3405 | 0.5756 | 0.7243 | so as to form at least one luminous area in at least one area of a plate.

2. The article of claim 1, wherein the luminescent compound emits in an area delimited by the following colorimetric coordinates (x, y):

| x | 0.3231 | 0.2702 | 0.2000 | 0.2550 | 0.3600 | 0.4087 | 0.3231 |
|---|--------|--------|--------|--------|--------|--------|--------|
| y | 0.6722 | 0.6158 | 0.3950 | 0.3650 | 0.5300 | 0.5896 | 0.6722. |

3. The article of claim 1, wherein the luminescent compound emits in an area delimited by the following colorimetric coordinates (x, y):

| x | 0.3231 | 0.2702 | 0.2000 | 0.2550 | 0.3451 | 0.3980 | 0.3231 |
|---|--------|--------|--------|--------|--------|--------|--------|
| y | 0.6722 | 0.6158 | 0.3950 | 0.3650 | 0.5437 | 0.6001 | 0.6722. |

4. The article of claim 1, wherein the luminescent compound presents an emission peak at a wavelength between 500 and 575 nm and with a mid-height width between 50 and 145 nm.

5. The article of claim 1, wherein the luminescent compound is adapted to function such that a portion of light emitted by the light source and transmitted through the luminescent compound has the following colorimetric coordinates (x, y):

| x | 0.460 | 0.385 | 0.255 | 0.190 | 0.175 | 0.180 | 0.305 | 0.385 | 0.460 |
|---|-------|-------|-------|-------|-------|-------|-------|-------|-------|
| y | 0.440 | 0.425 | 0.305 | 0.255 | 0.270 | 0.310 | 0.485 | 0.510 | 0.440. |

6. The article of claim 1, wherein the luminescent compound is adapted to function such that a portion of light emitted by the light source and transmitted through the luminescent compound has the following colorimetric coordinates (x, y):

| x | 0.305 | 0.180 | 0.180 | 0.200 | 0.235 | 0.265 | 0.330 | 0.385 | 0.305 |
|---|-------|-------|-------|-------|-------|-------|-------|-------|-------|
| y | 0.485 | 0.310 | 0.280 | 0.265 | 0.330 | 0.315 | 0.380 | 0.425 | 0.485. |

7. The article of claim 1, wherein the luminescent compound is adapted to function such that a portion of light emitted by the light source and transmitted through the luminescent compound has the following colorimetric coordinates (x, y):

| x | 0.260 | 0.180 | 0.200 | 0.235 | 0.265 | 0.330 | 0.260 |
|---|-------|-------|-------|-------|-------|-------|-------|
| y | 0.420 | 0.280 | 0.265 | 0.330 | 0.315 | 0.380 | 0.420. |

8. The article of claim 1, wherein the luminescent compound is adapted to function with the glass-ceramic and the light source so as to form at least one luminous area having a white color on at least one area of the plate having the following colorimetric coordinates (x, y):

| x | 0.4791 | 0.3983 | 0.3382 | 0.2668 | 0.2810 | 0.3523 | 0.4124 | 0.4932 | 0.4791 |
|---|--------|--------|--------|--------|--------|--------|--------|--------|--------|
| y | 0.4217 | 0.3979 | 0.3590 | 0.2877 | 0.2735 | 0.3449 | 0.3838 | 0.4076 | 0.4217. |

9. The article of claim 1, wherein the luminescent compound is adapted to function with the glass-ceramic and the light source so as to form at least one luminous area having a white color with the following colorimetric coordinates (x, y):

| x | 0.4039 | 0.3381 | 0.2801 | 0.2942 | 0.3523 | 0.4181 | 0.4039 |
|---|--------|--------|--------|--------|--------|--------|--------|
| y | 0.4005 | 0.3589 | 0.3032 | 0.2891 | 0.3448 | 0.3864 | 0.4005. |

10. The article of claim 1, wherein the luminescent compound is adapted to function with the glass-ceramic and the light source so as to form at least one luminous area having a white color with the following colorimetric coordinates (x, y):

| x | 0.3409 | 0.3001 | 0.2800 | 0.2942 | 0.3142 | 0.3550 | 0.3409 |
|---|--------|--------|--------|--------|--------|--------|--------|
| y | 0.3609 | 0.3245 | 0.3031 | 0.2889 | 0.3104 | 0.3468 | 0.3609. |

11. The article of claim 1, wherein the glass-ceramic substrate comprises the following components and/or is produced by ceramization from a glass having the following composition:
$SiO_2$: 52-75%;
$Al_2O_3$: 18-27%;
$Li_2O$: 2.5-5.5%;
$K_2O$: 0-3%;
$Na_2O$: 0-3%;
ZnO: 0-3.5%;
MgO: 0-3%;
CaO: 0-2.5%;
BaO: 0-3.5%;
SrO: 0-2%;
$TiO_2$: 1.2-5.5%;
$ZrO_2$: 0-3%; and
$P_2O_5$: 0-8%.

12. The article of claim 1, wherein the glass-ceramic substrate comprises less than 0.2% of coloring agents.

13. The article of claim 1, wherein the glass-ceramic substrate comprises one or more of the following coloring agents in the following proportions:
$V_2O_5$: 0.005%-0.2%;
$Fe_2O$: 0-0.2%;
CoO: 0-1%;
NiO: 0-0.005%;
CuO: 0-0.005%;
MnO: 0-0.05%;
$Rb_2O$: 0-0.1%;
$As_2O_3+Sb_2O_3$: 0-0.1%; and
$Cr_2O_3$: 0-0.0015%.

14. The article of claim 1, comprising a luminescent medium, formed by the luminescent compound and a matrix incorporating it, has an absorbance $A_\lambda$ greater than 0.274 at the emission wavelength of the light source.

15. The article of claim 1, wherein the luminous area has a luminance value of more than 10 candela/m².

16. The article of claim 1, wherein the luminescent compound is incorporated in a silicone or acrylate binder.

17. The article of claim 1, in the form of a cooking device, a device for maintaining at high temperature, or both, wherein the article further comprises one or more heating elements.

18. A process for selecting a luminescent compound for the article of claim 1, the process comprising:
1) placing a target color or colors in a CIExyY (1931) three-color diagram;
2) placing a point ($x_s$, $y_s$) corresponding to a chosen source seen through the glass-ceramic substrate in the CIExyY (1931) three-color diagram;
3) placing a point ($x_l$, $y_l$) corresponding to a luminescent medium, formed from a luminescent compound and optionally a matrix incorporating it, seen through the glass-ceramic plate, in the CIExyY (1931) three-color diagram;
4) a whole set of colors that can be synthesized by this combination corresponding to a straight line linking the points placed on the diagram in step 2) and step 3), if this straight line cuts the point or the area of points defined in step 1), this combination of source/luminescent medium is accepted and the method moves to step 5), otherwise it restarts at step 3) with another luminescent compound until the straight line cuts the point or the area of points defined in step 1), thus enabling the luminescent compound for obtaining the target color to be selected; and
5) noting coordinates ($x_c$, $y_c$) of the point of intersection found in step 4), this point of intersection being the barycentre of the points defined in steps 2) and 3), to which coefficients $\alpha$ and $\beta$, respectively, are assigned, such that $\alpha=(x_c-x_l)/(x_s-x_l)$ and $\beta=(x_c-x_s)/(x_l-x_s)$, and an amount of luminescent compound is determined by carrying out a plurality of depositions of the luminescent medium while varying the concentration of the luminescent compound and/or the thickness of the deposited luminescent medium and then selecting a specimen which allows to reach the point of the desired color through the glass-ceramic, or by measuring the emission spectrum of the specimens, calculating the ratio between the peak luminous intensity of the luminescent compound and the peak luminous intensity of the source, and selecting the specimen for which this ratio is equal to $\beta/\alpha$.

19. A process of manufacturing the article of claim 1, the process comprising inserting at least one luminescent compound between a glass-ceramic plate and at least one light source.

* * * * *